(12) United States Patent
Matsuo et al.

(10) Patent No.: US 8,329,553 B2
(45) Date of Patent: Dec. 11, 2012

(54) METHOD FOR MANUFACTURING SEMICONDUCTOR DEVICE AND NAND-TYPE FLASH MEMORY

(75) Inventors: Shogo Matsuo, Oita (JP); Takeshi Hoshi, Yokohama (JP); Keisuke Nakazawa, Yokohama (JP); Kazuaki Iwasawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 451 days.

(21) Appl. No.: 12/730,099

(22) Filed: Mar. 23, 2010

(65) Prior Publication Data

US 2010/0311220 A1    Dec. 9, 2010

(30) Foreign Application Priority Data

Jun. 8, 2009 (JP) ................................ 2009-136986

(51) Int. Cl.
*H01L 21/76* (2006.01)
(52) U.S. Cl. ........ 438/433; 438/427; 438/430; 438/431; 257/510
(58) Field of Classification Search .................. 438/433, 438/427, 430, 431; 257/510
See application file for complete search history.

(56) References Cited

U.S. PATENT DOCUMENTS

| | | | |
|---|---|---|---|
| 7,160,782 B2 * | 1/2007 | Wise et al. ..................... | 438/296 |
| 7,538,047 B2 | 5/2009 | Kawasaki et al. | |
| 7,582,572 B2 | 9/2009 | Iwasawa | |
| 7,598,151 B2 | 10/2009 | Hoshi et al. | |
| 7,718,505 B2 * | 5/2010 | Vannucci et al. ............. | 438/424 |
| 2004/0212035 A1 * | 10/2004 | Yeo et al. ........................ | 257/510 |
| 2007/0155121 A1 * | 7/2007 | Frohberg et al. .............. | 438/424 |
| 2008/0003775 A1 * | 1/2008 | Yamada et al. ................ | 438/427 |
| 2008/0150037 A1 * | 6/2008 | Teo et al. ........................ | 257/374 |
| 2009/0256233 A1 * | 10/2009 | Eun ................................ | 257/510 |

FOREIGN PATENT DOCUMENTS

| | | |
|---|---|---|
| JP | 2003-031650 | 1/2003 |
| JP | 2008-103645 | 5/2008 |

OTHER PUBLICATIONS

Iwasawa et al, "Semiconductor Device Manufacturing Method and Silicon Oxide Film Forming Method", U.S. Appl. No. 12/691,483, filed Jan. 21, 2010.

* cited by examiner

*Primary Examiner* — Zandra Smith
*Assistant Examiner* — Errol Fernandes
(74) *Attorney, Agent, or Firm* — Finnegan, Henderson, Farabow, Garrett & Dunner, L.L.P.

(57) ABSTRACT

A method for manufacturing semiconductor device has forming a plurality of trenches having at least two kinds of aspect ratios on a semiconductor substrate, filling the plurality of trenches with a coating material containing silicon, forming a mask on the coating material in a part of the trenches among the plurality of trenches filled with the coating material, implanting an ion for accelerating oxidation of the coating material into the coating material in the trenches on which the mask is not formed, forming a first insulating film by oxidizing the coating materials into which the ion is implanted, removing the coating material from the part of the trenches after removing the mask and forming a second insulating film in the part of the trenches from which the coating material is removed.

20 Claims, 6 Drawing Sheets

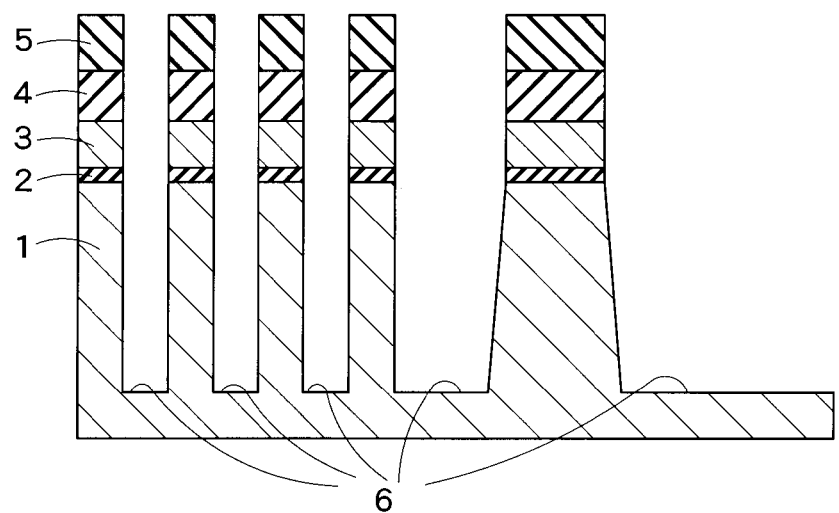
F I G. 2
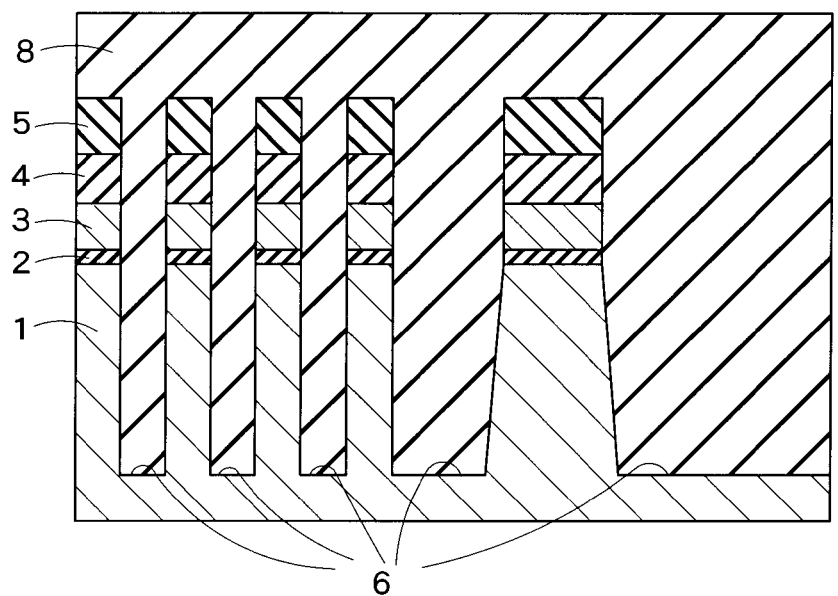
F I G. 3

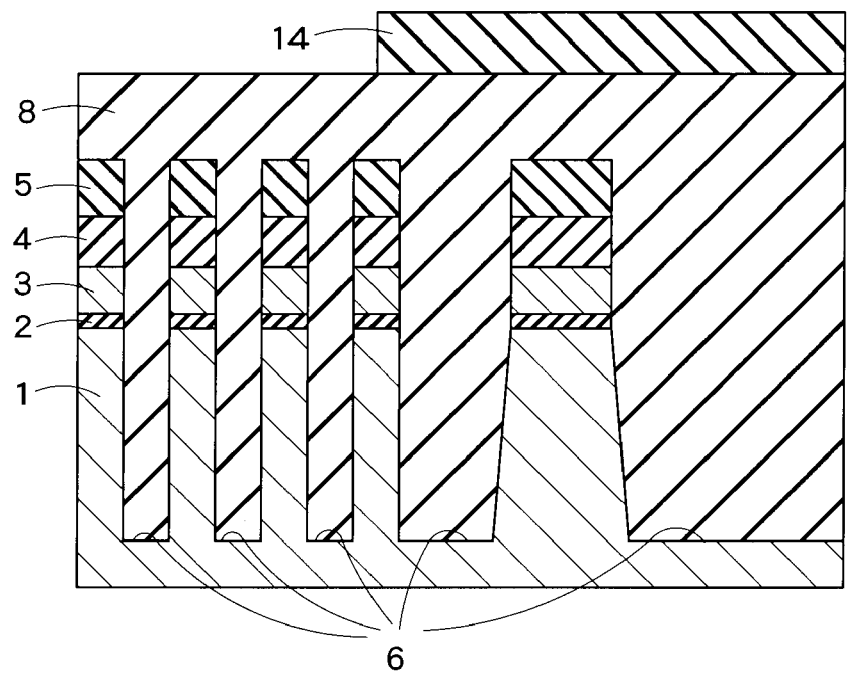
F I G. 4
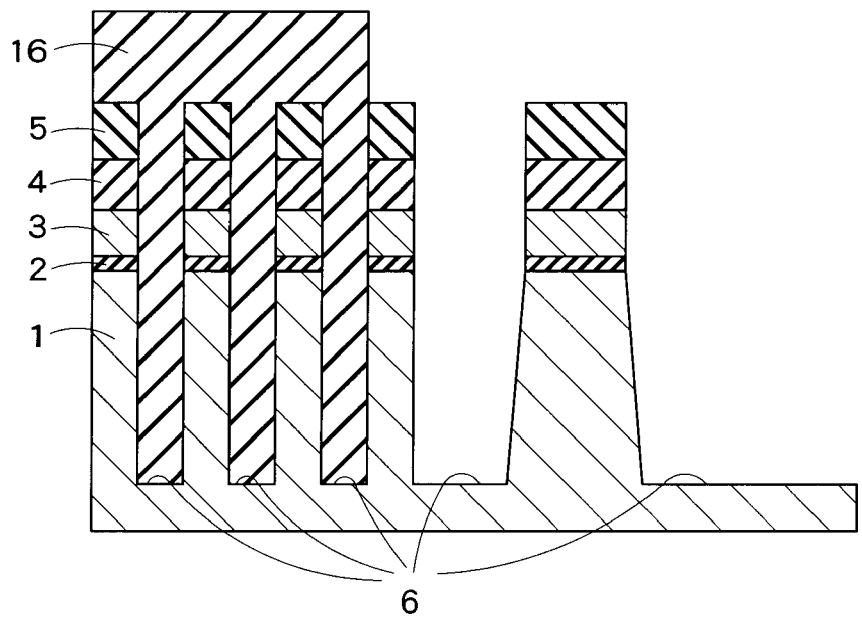
F I G. 5

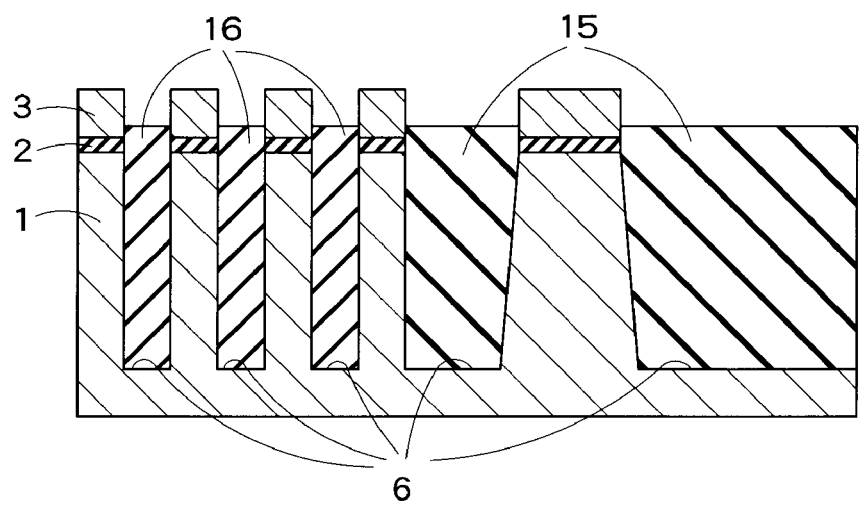
F I G. 8
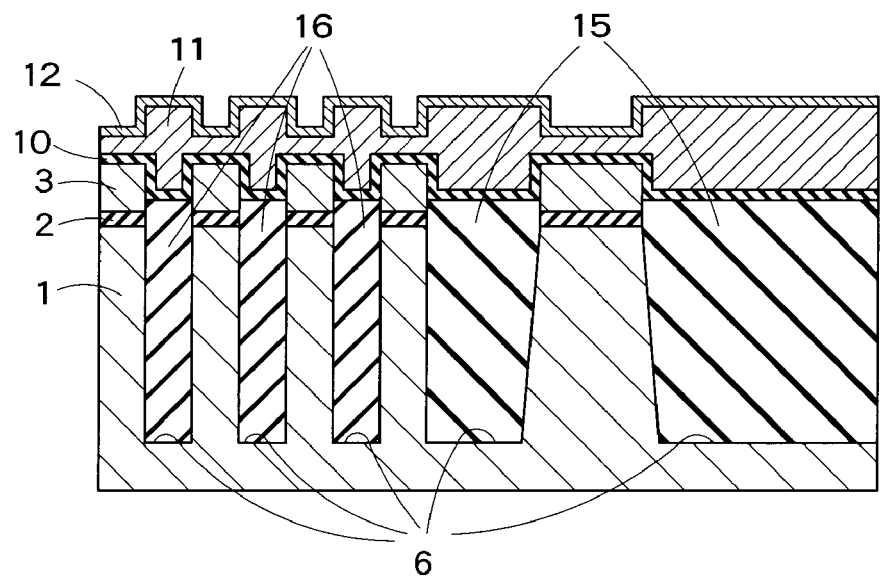
F I G. 9

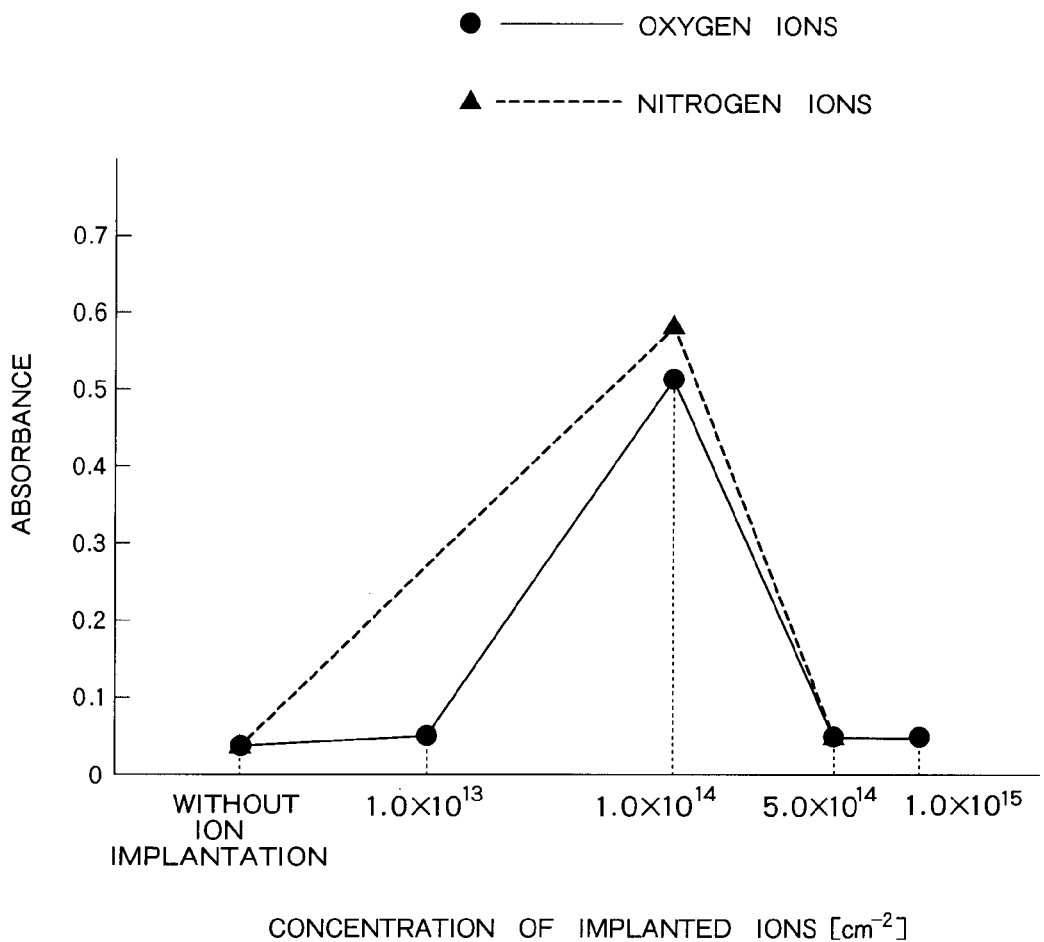
F I G. 10

METHOD FOR MANUFACTURING SEMICONDUCTOR DEVICE AND NAND-TYPE FLASH MEMORY

CROSS REFERENCE TO RELATED APPLICATIONS

This application is based upon and claims the benefit of priority from the prior Japanese Patent Application No. 2009-136986 filed on Jun. 8, 2009, the entire contents of which are incorporated herein by reference.

BACKGROUND OF THE INVENTION

1. Field of the Invention

The invention relates to a method for manufacturing a semiconductor device and a NAND-type flash memory having element isolation regions.

2. Related Art

In order to miniaturize a semiconductor device, it is important to miniaturize element isolation regions for insulating elements from each other. As one of element isolation techniques, an STI (Shallow Trench Isolation) technique is used to fill minute trenches formed in a semiconductor substrate with an insulating film. In order to miniaturize the semiconductor device, it is necessary to narrow the width of STI trenches, and the trenches can have a width of 30 nm or smaller in recent years. As the width of the trench becomes smaller, the ratio of the trench depth to the trench width (aspect ratio) becomes relatively large. This is because the trench having the small aspect ratio decreases insulation property.

For example, it is inevitable for miniaturizing a NAND-type flash memory to narrow the trench width between memory cells for storing 1-bit information, and thus aspect ratio of the trench has to be enlarged. On the other hand, the width of the element isolation region arranged between a memory cell and a peripheral circuit such as a control circuit may be relatively large, which leads to a small aspect ratio, and particularly high insulation property is required in order to decrease leak current.

Generally, insulating films for isolating elements are formed by a high density plasma CVD (Chemical Vapor Deposition) technique, for example. Because the high density plasma CVD technique can form high quality insulating films having high insulation property. However, it is difficult to form the insulating film in the STI trench having a large aspect ratio by the high density plasma CVD technique. This is because, in this technique, step coverage (the ratio of the film thickness in the trench portion to that in the flat portion) is poor and the opening of a trench having a high aspect ratio is stuffed before completely filling the trench itself.

In another technique, the insulating film can be formed by filling the trench with a coating material and oxidizing the coating material. However, there is a problem that the bottom of the trench having a large aspect ratio cannot be sufficiently oxidized, thereby worsening the insulation property. In addition, the insulating film formed of the coating material contains more impurities than that formed by the high density plasma CVD technique. Therefore it is difficult to secure the insulation property required for element isolation between the memory cell and the peripheral circuit.

Patent document 1 (JP-A No. 2003-31650 (Kokai)) discloses a technique in which the bottom of the trench is filled with a high quality $SiO_2$ film by the high density plasma CVD technique while the top of the trench is filled with $SiO_2$ of a coating material. However, as stated above, it is difficult to fill the trench having a large aspect ratio with $SiO_2$ by the high density plasma CVD technique.

SUMMARY

According to one aspect of the present invention, a method for manufacturing semiconductor device comprising: forming a plurality of trenches having at least two kinds of aspect ratios on a semiconductor substrate; filling the plurality of trenches with a coating material containing silicon; forming a mask on the coating material in a part of the trenches among the plurality of trenches filled with the coating material; implanting an ion for accelerating oxidation of the coating material into the coating material in the trenches on which the mask is not formed; forming a first insulating film by oxidizing the coating materials into which the ion is implanted; removing the coating material from the part of the trenches after removing the mask; and forming a second insulating film in the part of the trenches from which the coating material is removed, an insulating property of the second insulating film being higher than an insulating property of the first insulating film.

According to the other aspect of the present invention, a method for manufacturing NAND-type flash memory comprising: depositing a film material for a gate insulating film and a film material for a floating gate sequentially on a semiconductor substrate; forming a plurality of trenches for an element isolation region having at least two kinds of aspect ratios reaching to the semiconductor substrate through the film material for the gate insulating film and the film material for the floating gate, and forming the gate insulating film and the floating gate around the plurality of trenches; filling the plurality of trenches with a coating material containing silicon; forming a mask on the coating material in a part of the trenches around a boundary between a memory cell region and a peripheral circuit region; implanting an ion for accelerating oxidation of the coating material into the coating material in the trenches on which the mask is not formed; forming a first insulating film by oxidizing the coating materials into which the ion is implanted; removing the coating material from the part of the trenches after removing the mask; and forming a second insulating film in the part of the trenches from which the coating material is removed, an insulating property of the second insulating film being higher than an insulating property of the first insulating film.

According to the other aspect of the present invention, a method for manufacturing semiconductor device comprising: forming a plurality of trenches having at least two kinds of aspect ratios on a semiconductor substrate; filling the plurality of trenches with a coating material containing silicon; forming a mask on the coating material in a part of the trenches among the plurality of trenches filled with the coating material; implanting at least one ion of an oxygen ion, phosphorus ion, boron ion, nitrogen ion, germanium ion, silicon ion, argon ion into the coating material in the trenches on which the mask is not formed; forming a first insulating film by oxidizing the coating materials into which the ion is implanted; removing the coating material from the part of the trenches after removing the mask; and forming a second insulating film in the part of the trenches from which the coating material is removed, an insulating property of the second insulating film being higher than an insulating property of the first insulating film.

BRIEF DESCRIPTION OF THE DRAWINGS

FIG. 2 is a sectional view of the semiconductor device in its manufacturing process.

FIG. 3 is a sectional view of the semiconductor device in its manufacturing process following FIG. 2.

FIG. 4 is a sectional view of the semiconductor device in its manufacturing process following FIG. 3.

FIG. 5 is a sectional view of the semiconductor device in its manufacturing process following FIG. 4.

FIG. 8 is a sectional view of the semiconductor device in its manufacturing process following FIG. 7.

FIG. 9 is a sectional view of the semiconductor device in its manufacturing process following FIG. 8.

FIG. 10 is a graph showing the relationship between the concentration of the implanted oxygen ions or nitrogen ions and a Fourier transform infrared spectrometer (FTIR).

DETAILED DESCRIPTION OF THE INVENTION

Hereinafter, methods for manufacturing a semiconductor device and a NAND-type flash memory according to embodiments of the present invention will be specifically explained with reference to accompanying drawings.

Figure 1:
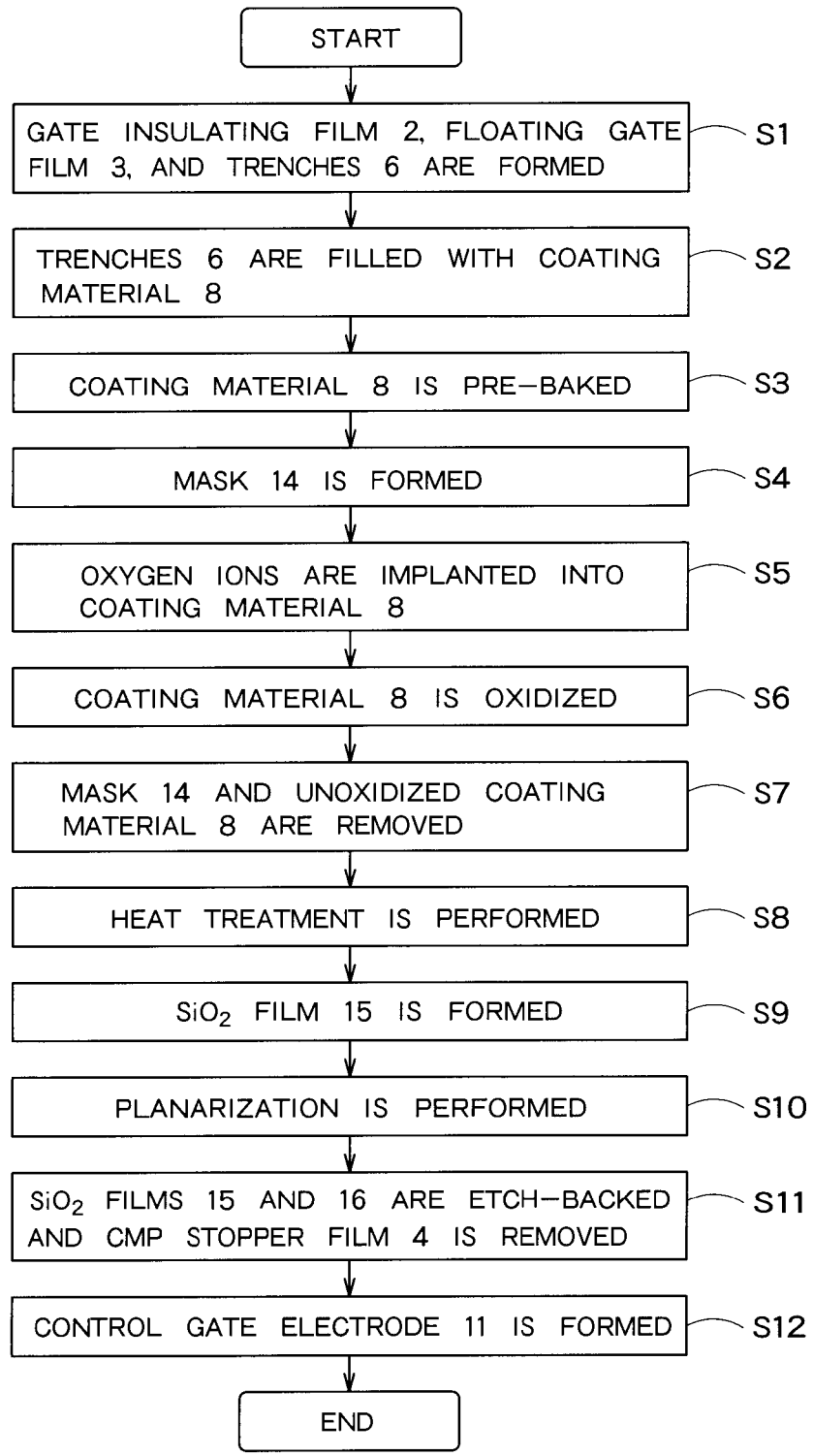
FIG. 1 is a process chart showing the steps of a manufacturing process for a semiconductor device according to an embodiment of the present invention.

FIG. 1 is a process chart showing the steps of a manufacturing process for a semiconductor device according to an embodiment of the present invention, and each of FIGS. 2 to 9 is a sectional view of the semiconductor device in its manufacturing process. The present embodiment will explain an example where the semiconductor device is a NAND-type flash memory.

Firstly, film materials of a gate insulating film 2, a floating gate film 3, a CMP (Chemical Mechanical Polishing) stopper film 4, and a mask film 5 are sequentially deposited on a semiconductor substrate 1. The film material of the gate insulating film 2 is SiON and has a film thickness of 8 nm, for example. The film material of the floating gate film 3 is phosphorus-doped polycrystalline silicon and has a film thickness of 80 nm, for example. The film material of the CMP stopper film 4 is SiN (silicon nitride) and has a film thickness of 70 nm, for example. The film material of the mask film 5 is $SiO_2$ (silicon oxide), for example.

Next, the film material of the mask film 5 is coated with a photoresist film (not shown), and the photoresist film is patterned by a normal lithography technique. After that, the mask film 5 is formed by etching the film material of the mask film 5 by an RIE (Reactive Ion Etching) technique using the patterned photoresist film as a mask material. The photoresist film is removed through ashing and etching using a mixed liquid of sulfuric acid and hydrogen peroxide water.

Then, the film materials of the CMP stopper film 4, the floating gate film 3, the gate insulating film 2, and the semiconductor substrate 1 are etched sequentially by the RIE technique using the mask film 5 as a hard mask material. By such a manner, the gate insulating film 2 and the floating gate film 3 are formed. At this time, the semiconductor substrate 1 is etched to have a depth of 220 nm, for example, and a plurality of STI trenches 6 are formed around the gate insulating film 2 and the floating gate film 3 (Step S1). In this way, the cross section structure shown in FIG. 2 is obtained. As shown in FIG. 2, the trenches 6 do not necessarily have the same width.

Note that in FIGS. 2 to 9, four protrusions on the left side represent the gate insulating film 2 and the floating gate film 3 of memory cell transistors of the NAND-type flash memory, while a protrusion on the right side represents a transistor of a peripheral circuit (such as a memory control circuit.) The width of the STI trench 6 between the memory cells is 30 nm, for example, and the width of the trench 6 between the memory cell and the peripheral circuit is 100 nm, for example. In this case, the aspect ratio of the trench 6 between the memory cells is 12 or greater, while the aspect ratio of the trench 6 between the memory cell and the peripheral circuit is approximately 4. As stated above, the trenches 6 have at least two kinds of aspect ratios.

Next, the trenches 6 are filled with a coating material 8 containing silicon by a spin coating technique, for example (Step S2). Here, the coating material 8 containing silicon is a material which forms $SiO_2$ through oxidization. Various kinds of materials can be used as the coating material 8, and the employment of a coating material having high fluidity such as polysilazane (polyperhydrosilazane: —(SiH$_2$NH)n-) and HSQ (hydrogen silses quioxane: —(HSiO$_{3/2}$)n) prevents a void and a seam from being formed in the insulating film and makes it possible to form an insulating film having higher insulation property.

In the present embodiment, polysilazane having an average molecular weight of 2000 to 6000 is used as the coating material 8. More specifically, in Step S2, solution generated by dissolving polysilazane in solvent such as xylene and dibutyl ether is dropped on the spinning semiconductor substrate 1 to coat the semiconductor substrate 1 by a thickness of 400 to 600 nm, for example, so that the trenches 6 are filled. After that, pre-bake is performed for three minutes using a hot plate at 150° C., for example, to evaporate the solvent (Step S3). By performing the pre-bake, polysilazane filling the trenches 6 becomes nearly an SiN film having a low density. In this way, the cross section structure shown in FIG. 3 is obtained.

Then, the coating material 8 is coated with a photoresist film, and the photoresist film is patterned by the lithography technique, thereby forming a mask 14 made of the photoresist film (Step S4). Next, as shown in FIG. 4, the photoresist film is patterned so that the mask 14 is formed on the boundary between the memory cell region and the peripheral circuit region and on the peripheral circuit region. In other words, the coating material 8 above the trenches 6 having a large aspect ratio is exposed, while the coating material 8 above the trenches 6 having a small aspect ratio is covered with the mask 14 in order not to be exposed.

Next, oxygen ions are implanted into the coating material 8 using the mask 14 as a mask material (Step S5). At this time, the oxygen ions are implanted only into the coating material 8 filling the trenches 6 having a large aspect ratio, and are not implanted into the coating material 8 under the mask 14.

After that, the semiconductor substrate 1 is soaked in warm water at 65° C., for example, in a container, and absorbs oxygen in the warm water to oxidize the coating material 8 (Step S6). As a result, the coating material 8 filling the exposed trenches 6 is oxidized to form an $SiO_2$ film 16 (first insulating film). On the other hand, the coating material 8 under the mask 14 is hardly oxidized. As stated above, the oxygen ions previously implanted become cores to develop the reaction between oxygen absorbed in the process of Step S6 and silicon contained in the coating material 8, thereby filling the bottom of the trenches 6 with the $SiO_2$ film 16.

Note that in the process of Step S5, ions other than oxygen ions may be implanted to accelerate the oxidation of the coating material 8. For example, boron ions, phosphorus ions, nitrogen ions, germanium ions, silicon ions, argon ions, or the like may be implanted. When these ions are implanted, atomic bonds in the coating material 8 are ruptured, and oxygen absorbed in the process of Step 6 is easily bonded to silicon contained in the coating material 8, thereby accelerating the formation of the $SiO_2$ film 16.

Since the fluid point of the coating material 8 implanted with boron or phosphorus particularly becomes lower than that of the coating material 8 without the implantation, the fluidity of the coating material 8 is improved when performing heat treatment. Therefore, the bottom of the trenches 6 can be surely filled with the coating material 8, thereby improving the insulation property between the memory cells. Note that a plurality of kinds of ions may be implanted.

FIG. 10 is a graph showing the relationship between the concentration of the implanted oxygen ions or nitrogen ions and a Fourier transform infrared spectrometer (FTIR). The horizontal axis represents the concentration of the implanted oxygen ions or nitrogen ions. The vertical axis represents the absorbance of infrared rays having a wave number of substantially 1100 $cm^{-1}$. When silicon atoms and oxygen atoms are bonded, stretching vibrations at the frequency corresponding to this wave number are generated and irradiated infrared rays are absorbed. Therefore, as the $SiO_2$ film 16 is formed more, the absorbance becomes higher.

As seen from FIG. 10, the absorbance is extremely high when the concentration of the implanted oxygen ions is $1.0*10^{14}$ $cm^{-2}$ comparing the case without ion implantation. In this way, a great effect of accelerating the formation of the $SiO_2$ film 16 can be obtained by implanting oxygen ions having a concentration of $1.0*10^{14}$ $cm^{-2}$.

On the other hand, the absorbance is slightly high when the concentration of implanted oxygen ions is $1.0*10^{13}$ $cm^{-2}$, $5.0*10^{14}$ $cm^{-2}$, and $1.0*10^{15}$ $cm^{-2}$ comparing the case without ion implantation. Oxygen ions having a concentration of $1.0*10^{13}$ $cm^{-2}$, which means that the amount of oxygen ions is too small, are not enough to effectively accelerate the oxidation of the coating material 8. Further, oxygen ions having a concentration of $5*10^{14}$ $cm^{-2}$ or greater, which means that the amount of oxygen ions is too large, oxidize the top of the coating material 8 and form $SiO_2$ faster than the other area. As a result, $SiO_2$ formed in the top of the coating material 8 becomes a block to make it difficult for the coating material 8 to absorb more oxygen, and thus the oxidation of the coating material 8 in the bottom of the trenches 6 cannot be accelerated sufficiently.

Further, as seen from FIG. 10, a great effect of accelerating the formation of the $SiO_2$ film 16 can be also obtained by implanting nitrogen ions having a concentration of $1.0*10^{14}$ $cm^{-2}$.

Note that it is preferable that the concentration of the implanted oxygen ions and nitrogen ions is more than $1.0*10^{13}$ $cm^{-2}$ and less than $5.0*10^{14}$ $cm^{-2}$. However, the concentration can be modified according to the formation condition of the oxide film.

Further, in Step S5, the oxygen ions or the like does not necessarily implanted into the bottom of the trenches 6. The depth to implant the ions is not limited, and can be equal to or less than 10% of the thickness from the bottom to the surface of the trench 6, for example. Also in this case, the coating material 8 in the bottom of the trench 6 can be oxidized due to the effect of the ions implanted on the surface.

After the $SiO_2$ film 16 is formed, the mask 14 is removed through ashing and etching using a mixed liquid of sulfuric acid and hydrogen peroxide water, and is successively cleaned by warm water or DHF (diluted hydrofluoric acid). As a result, the $SiO_2$ film 16 formed in the trenches 6 is extremely slightly removed, while the coating material 8 under the mask 14 and not implanted with oxygen ions is removed (Step S7 of FIG. 1). This is because the $SiO_2$ film 16 formed by oxidizing polysilazane has high resistance to warm water or DHF, while unoxidized polysilazane, that is, prebaked SiN has low resistance, which leads to a high etching rate. In this way, the cross section structure shown in FIG. 5 is obtained. Although FIG. 5 shows an example where the coating material 8 filling the trench 6 between the memory cell and the peripheral circuit is completely removed, there are no problems if a little amount of the coating material 8 is left in the trench 6.

After that, in order to further improve the film quality of the $SiO_2$ film 16 filling the trenches 6, heat treatment is performed at 300° C., for example, under the atmosphere of steam, oxygen, or nitrogen (Step S8).

Figure 6:
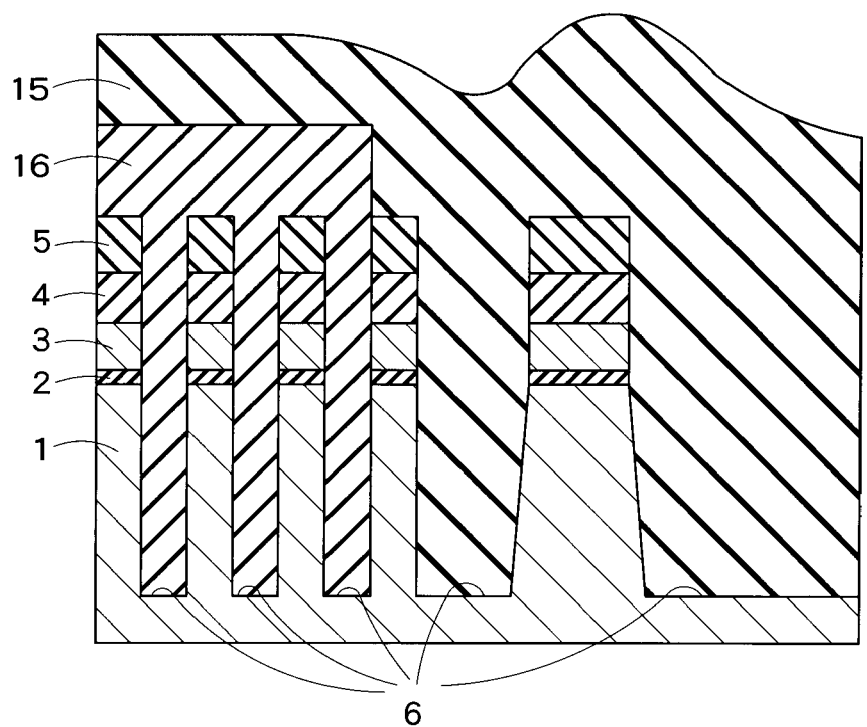
FIG. 6 is a sectional view of the semiconductor device in its manufacturing process following FIG. 5.

After that, an $SiO_2$ film 15 (second insulating film) is deposited by the high density plasma CVD technique or TEOS (Tetra Ethoxy Silane)/$O_3$ technique. As a result, the trenches 6 in which the $SiO_2$ film 16 is not formed are filled with the $SiO_2$ film 15 (Step S9). In this way, the cross section structure shown in FIG. 6 is obtained. In the high density plasma CVD technique or TEOS/$O_3$ technique, it is difficult to form the insulating film in the trench 6 having a large aspect ratio since the opening of the trench is stuffed before completely filling the trench itself. However, in such techniques, the trench 6 having a small aspect ratio can be easily filled with a high quality insulating film containing fewer impurities than the insulating film formed by oxidizing the coating material. Accordingly, the trench 6 between the memory cell and the peripheral circuit is filled with the $SiO_2$ film 15 whose insulation property is higher than that of the $SiO_2$ film 16 formed of the coating material 8.

Figure 7:
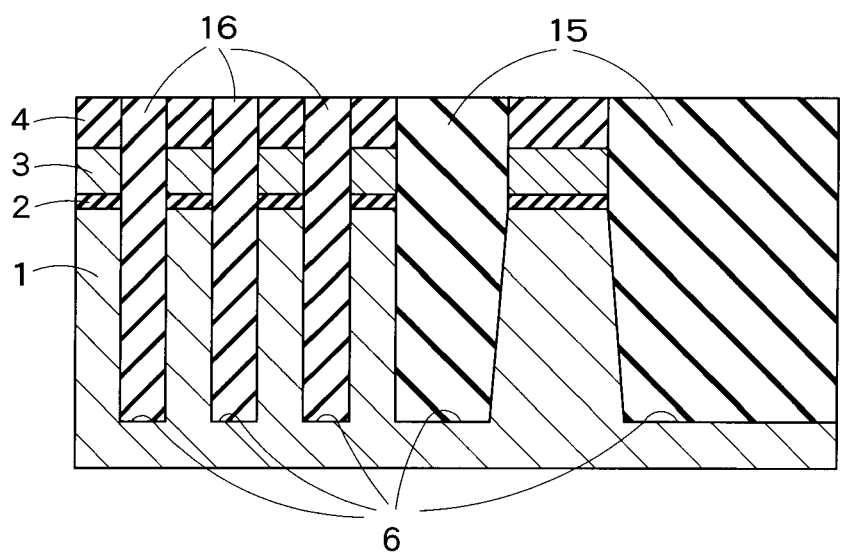
FIG. 7 is a sectional view of the semiconductor device in its manufacturing process following FIG. 6.

Next, planarization by the CMP technique is performed using the CMP stopper film 4 as a stopper (Step S10), and the cross section structure shown in FIG. 7 is obtained. After that, the insulating film filling the trenches 6 is etch-backed by 120 nm, for example, by the RIE technique. Further, the CMP stopper film 4 is removed in phosphoric acid heated at 150° C., for example (Step S11). In this way, the cross section structure shown in FIG. 8 is obtained.

After that, an interelectrode insulating film 10, control gate electrodes 11 formed of phosphorus-doped polycrystalline silicon, for example, a WSi film 12, and an SiN film 13 are formed by the lithography technique and RIE technique (Step S12). In this way, the cross section structure shown in FIG. 9 is obtained. After that, an interlayer insulating film and wiring (not shown) are formed to complete the NAND-type flash memory.

Note that as long as the heat treatment process for improving the film quality of the $SiO_2$ film 16 (Step S8) is performed before the process for depositing the interelectrode insulating film 10 (Step S12), the heat treatment process can be performed at a different timing, for example, after the process for oxidizing the coating material 8 (Step S6) or after the planarization process (Step S10).

As stated above, in the present embodiment, the coating material 8 fills the STI trenches 6 having a large aspect ratio and the oxygen ions or the like are implanted, and then oxidation treatment is performed. Therefore the bottom of the trenches 6 can be filled with the $SiO_2$ film 16. On the other hand, the trenches 6 having a small aspect ratio are filled with the insulating film of the SiO$_2$ film 15 whose insulation property is higher than that of the SiO$_2$ film 16 because the SiO$_2$ film 15 is formed by the high density plasma CVD technique or TEOS/O$_3$ technique. Thus, since the insulating film is formed by the optimum technique according to the aspect ratio of the trench 6, the elements of the semiconductor device can be surely insulated regardless of the aspect ratio of the element isolation region.

The above embodiment explains an example of manufacturing a NAND-type flash memory. However, the present embodiment can be applied to different semiconductor devices with element isolation regions having a plurality of aspect ratios. The technique explained in the above embodiment is particularly suitable for manufacturing a semiconductor device in which the element isolation regions are formed both in the STI trenches having an aspect ratio exceeding 10 and that having an aspect ratio of 10 or smaller.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method for manufacturing semiconductor device comprising:
    forming a plurality of trenches having at least two kinds of aspect ratios on a semiconductor substrate;
    filling the plurality of trenches with a coating material containing silicon;
    forming a mask on the coating material over a portion of the trenches among the plurality of trenches filled with the coating material;
    implanting an ion for accelerating oxidation of the coating material into the coating material in the trenches on which the mask is not formed;
    forming a first insulating film by oxidizing the coating materials into which the ion is implanted;
    after removing the mask, completely removing the coating material from the portion of the trenches previously covered by the mask; and
    forming a second insulating film in the portion of the trenches from which the coating material is removed, an insulating property of the second insulating film being higher than an insulating property of the first insulating film.

2. The method of claim 1, wherein an aspect ratio of the trench in which the first insulating film is formed is larger than an aspect ratio of the trench in which the second insulating film is formed.

3. The method of claim 1, wherein upon implanting the ion, at least one ion of an oxygen ion, phosphorus ion, boron ion, nitrogen ion, germanium ion, silicon ion, argon ion is implanted.

4. The method of claim 1, wherein upon implanting the ion, an oxygen ion or a nitrogen ion is implanted, a concentration of the implanted ion being more than $1.0*10^{13}$ cm$^{-2}$ and less than $5.0*10^{14}$ cm$^{-2}$.

5. The method of claim 1, wherein upon filling the coating material, the trenches are filled with polysilazane or HSQ as the coating material.

6. The method of claim 1, wherein upon implanting the ion, the ion for improving a fluidity of the coating material is implanted.

7. The method of claim 1, wherein removing the coating material, the coating material in the pan portion of the trenches is removed by etching technique using an etchant, an etching rate of the etchant to the coating material being higher than an etching rate of the etchant to the first insulating film.

8. The method of claim 1 further comprising performing heat treatment after forming the first insulating film.

9. The method of claim 1, wherein upon forming the second insulating film, the second insulating film is formed by a plasma CVD technique or a TEOS (Tetra Ethoxy Silane)/O$_3$ technique.

10. A method for manufacturing NAND-type flash memory comprising:
    depositing a film material for a gate insulating film and a film material for a floating gate sequentially on a semiconductor substrate;
    forming a plurality of trenches for an element isolation region having at least two kinds of aspect ratios reaching to the semiconductor substrate through the film material for the gate insulating film and the film material for the floating gate, and forming the gate insulating film and the floating gate around the plurality of trenches;
    filling the plurality of trenches with a coating material containing silicon;
    forming a mask on the coating material over a portion of the trenches around a boundary between a memory cell region and a peripheral circuit region;
    implanting an ion for accelerating oxidation of the coating material into the coating material in the trenches on which the mask is not formed;
    forming a first insulating film by oxidizing the coating materials into which the ion is implanted;
    after removing the mask, completely removing the coating material from the portion of the trenches previously covered by the mask; and
    forming a second insulating film in the portion of the trenches from which the coating material is removed, an insulating property of the second insulating film being higher than an insulating property of the first insulating film.

11. The method of claim 10, wherein an aspect ratio of the trench in which the first insulating film is formed is larger than an aspect ratio of the trench in which the second insulating film is formed.

12. The method of claim 10, wherein upon implanting the ion, at least one ion of an oxygen ion, phosphorus ion, boron ion, nitrogen ion, germanium ion, silicon ion, argon ion is implanted.

13. The method of claim 10, wherein upon implanting the ion, an oxygen ion or a nitrogen ion is implanted, a concentration of the implanted ion being more than $1.0*10^{13}$ cm$^{-2}$ and less than $5.0*10^{14}$ cm$^{-2}$.

14. The method of claim 10, wherein upon filling the coating material, the trenches are filled with polysilazane or HSQ as the coating material.

15. The method of claim 10, wherein upon implanting the ion, the ion for improving a fluidity of the coating material is implanted.

16. The method of claim 10, wherein removing the coating material, the coating material in the portion of the trenches is removed by etching technique using an etchant, an etching rate of the etchant to the coating material being higher than an etching rate of the etchant to the first insulating film.

17. The method of claim 10 further comprising performing heat treatment after forming the first insulating film.

18. The method of claim 10, wherein upon forming the second insulating film, the second insulating film is formed by a plasma CVD technique or a TEOS (Tetra Ethoxy Silane)/$O_3$ technique.

19. A method for manufacturing semiconductor device comprising:
forming a plurality of trenches having at least two kinds of aspect ratios on a semiconductor substrate;
filling the plurality of trenches with a coating material containing silicon;
forming a mask on the coating material over a portion of the trenches among the plurality of trenches filled with the coating material;
implanting at least one ion of an oxygen ion, phosphorus ion, boron ion, nitrogen ion, germanium ion, silicon ion, argon ion into the coating material in the trenches on which the mask is not formed;
forming a first insulating film by oxidizing the coating materials into which the ion is implanted;
after removing the mask, completely removing the coating material from the portion of the trenches previously covered by the mask; and
forming a second insulating film in the portion of the trenches from which the coating material is removed, an insulating property of the second insulating film being higher than an insulating property of the first insulating film.

20. The method of claim 19, wherein an aspect ratio of the trench in which the first insulating film is formed is larger than an aspect ratio of the trench in which the second insulating film is formed.

* * * * *